US009515120B2

(12) United States Patent
Um et al.

(10) Patent No.: US 9,515,120 B2
(45) Date of Patent: Dec. 6, 2016

(54) IMAGE SENSOR

(71) Applicant: SAMSUNG ELECTRONICS CO., LTD., Suwon-si, Gyeonggi-do (KR)

(72) Inventors: Changyong Um, Seoul (KR); Youngwoo Jung, Yongin-si (KR); Jungchak Ahn, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/973,855

(22) Filed: Dec. 18, 2015

(65) Prior Publication Data
US 2016/0225815 A1  Aug. 4, 2016

(30) Foreign Application Priority Data
Jan. 30, 2015  (KR) .................. 10-2015-0014801

(51) Int. Cl.
H01L 31/0232 (2014.01)
H01L 21/00 (2006.01)
H01L 27/148 (2006.01)
H01L 27/146 (2006.01)

(52) U.S. Cl.
CPC ..... *H01L 27/14818* (2013.01); *H01L 27/1462* (2013.01)

(58) Field of Classification Search
CPC ...... H01L 25/048; H01L 27/288; H01L 27/30; H01L 27/32; H01L 27/3239; H01L 31/143; H01L 31/162; H01L 33/06; H01L 33/08; H01L 33/18; H01L 33/24; H01L 33/26; H01L 51/0032; H01L 51/50

USPC ... 257/432, 233, 225, 43, 294, 291, 77, 292; 438/22–47, 69, 493, 503, 507, 956
See application file for complete search history.

(56) References Cited

U.S. PATENT DOCUMENTS

| 7,511,257 | B2 | 3/2009 | Lee et al. |
| 8,129,809 | B2 | 3/2012 | Jang |
| 8,405,177 | B2 | 3/2013 | Hsu et al. |
| 8,587,081 | B2 | 11/2013 | Chao |
| 8,614,113 | B2 | 12/2013 | Ahn et al. |
| 8,664,578 | B2 | 3/2014 | Hirigoyen et al. |
| 9,034,682 | B2 | 5/2015 | Shim et al. |

(Continued)

FOREIGN PATENT DOCUMENTS

| KR | 10-2011-0079318 A | 7/2011 |
| KR | 10-2013-0017057 A | 2/2013 |

*Primary Examiner* — Selim Ahmed
*Assistant Examiner* — Moin Rahman
(74) *Attorney, Agent, or Firm* — Lee & Morse P.C.

(57) ABSTRACT

An image sensor includes a substrate with a unit pixel defined by a first separation pattern, a photoelectric conversion part in the substrate, a photocharge storage in the substrate, the photocharge storage being adjacent to the photoelectric conversion part, a second separation pattern between the photoelectric conversion part and the photocharge storage, a shielding part on a bottom surface of the substrate to cover the photocharge storage, the shielding part including a first protrusion extending into the substrate and toward the first separation pattern, and an extension extending from the first protrusion to cover the bottom surface of the substrate; and an anti-reflection layer between the shielding part and the substrate, the anti-reflection layer having an overhang structure between the first protrusion and the extension.

20 Claims, 12 Drawing Sheets

(56) References Cited

U.S. PATENT DOCUMENTS

2011/0205410 A1* 8/2011 Ahn ................ H01L 27/14621
  348/273
2014/0239362 A1   8/2014 Koo et al.
2014/0246707 A1   9/2014 Koo et al.
2014/0264694 A1   9/2014 Seko

* cited by examiner

IMAGE SENSOR

CROSS-REFERENCE TO RELATED APPLICATION

Korean Patent Application No. 10-2015-0014801, filed on Jan. 30, 2015, in the Korean Intellectual Property Office, and entitled: "Image Sensor," is incorporated by reference herein in its entirety.

BACKGROUND

1. Field

Example embodiments relate to an image sensor, and in particular, to a complementary metal-oxide semiconductor (CMOS) image sensor.

2. Description of the Related Art

An image sensor is a device that converts optical images into electrical signals. With increased development of the computer and communications industries, there is an increased demand for high performance image sensors in a variety of applications, e.g., digital cameras, camcorders, personal communication systems, gaming machines, security cameras, micro-cameras for medical applications, and/or robots.

The image sensors may be generally classified into charge coupled device (CCD) and complementary metal-oxide semiconductor (CMOS) image sensors. The CMOS image sensors are operated using a simple operation method and are configured to have signal processing circuits integrated on a single chip, and thus, it is possible to realize products including scaled CMOS image sensors. In addition, CMOS image sensors may operate with relatively low consumption power, and thus, they are applicable to a product with low battery capacity (e.g., portable electronic devices).

As the electronic industry advances, there is an increasing demand for an image sensor with a high density and a reduced pixel size, and many researches are being conducted to develop such an image sensor.

SUMMARY

According to example embodiments, an image sensor includes a substrate with a unit pixel defined by a first separation pattern, a photoelectric conversion part in the substrate, a photocharge storage in the substrate, the photocharge storage being adjacent to the photoelectric conversion part, a second separation pattern between the photoelectric conversion part and the photocharge storage, a shielding part on a bottom surface of the substrate to cover the photocharge storage, the shielding part including a first protrusion extending into the substrate and toward the first separation pattern, and an extension extending from the first protrusion to cover the bottom surface of the substrate; and an anti-reflection layer between the shielding part and the substrate, the anti-reflection layer having an overhang structure between the first protrusion and the extension.

In example embodiments, the anti-reflection layer may be spaced apart from the first separation pattern.

In example embodiments, the first protrusion of the shielding part may be in direct contact with the first separation pattern.

In example embodiments, the first separation pattern may have a surface, which is positioned near a bottom surface of the substrate, and whose center region is lower than its edge region.

In example embodiments, the shielding part may further include a second protrusion extending from the extension into the substrate and toward the second separation pattern, and the second protrusion may be continuously connected to the extension.

In example embodiments, the second separation pattern may have a surface, which is positioned near a bottom surface of the substrate, and whose center region is lower than its edge region.

In example embodiments, the anti-reflection layer may have an overhang structure between the second protrusion and the extension, and the anti-reflection layer may be spaced apart from the second separation pattern.

In example embodiments, the anti-reflection layer may be conformally provided between the second protrusion and the second separation pattern and may be in direct contact with the second separation pattern.

In example embodiments, the first protrusion of the shielding part may be self-aligned with the first separation pattern.

In example embodiments, the second protrusion of the shielding part may be self-aligned with the second separation pattern.

According to other example embodiments, an image sensor includes a substrate with a unit pixel defined by a first separation pattern, a photoelectric conversion part in the substrate, a photocharge storage in the substrate, the photocharge storage being adjacent to the photoelectric conversion part, a second separation pattern between the photoelectric conversion part and the photocharge storage, a shielding part on a bottom surface of the substrate to cover the photocharge storage, the shielding part including a first protrusion extending into the substrate and toward the first separation pattern, a second protrusion extending into the substrate and toward the second separation pattern, and an extension connecting the first and second protrusions to each other.

In example embodiments, the image sensor may further include an anti-reflection layer between the shielding part and the substrate.

In example embodiments, the anti-reflection layer may be conformally provided on a bottom surface of the substrate and the first and second separation patterns.

In example embodiments, the anti-reflection layer may be spaced apart from the first separation pattern and may have an overhang structure between the first protrusion and the extension.

In example embodiments, the anti-reflection layer may be spaced apart from the second separation pattern and may have an overhang structure between the second protrusion and the extension.

According to other example embodiments, an image sensor includes a substrate with a unit pixel defined by a first separation pattern, a photoelectric conversion part in the substrate, a photocharge storage in the substrate, the photocharge storage being adjacent to the photoelectric conversion part, a second separation pattern between the photoelectric conversion part and the photocharge storage, a shielding part on a bottom surface of the substrate to cover the photocharge storage, the shielding part including a first protrusion extending into the substrate and toward the first separation pattern, and an extension extending from the first protrusion to cover the photocharge storage, and an anti-reflection layer between the shielding part and the photocharge storage, the anti-reflection layer extending on a surface of the photocharge storage facing away from the substrate and on a portion of a lateral surface of the photocharge storage.

In example embodiments, the anti-reflection layer may be continuous on the surface of the photocharge storage facing away from the substrate and on the portion of the lateral surface of the photocharge storage.

In example embodiments, the first protrusion may directly contact the first separation pattern and the anti-reflection layer.

In example embodiments, the first separation pattern may define a trench between adjacent unit pixels, the first protrusion completely filling the trench and being continuous with the extension of the shielding part.

In example embodiments, the extension of the shielding part may completely cover the photocharge storage and the second separation pattern, at least a majority surface of the photoelectric conversion part being exposed by the shielding part.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
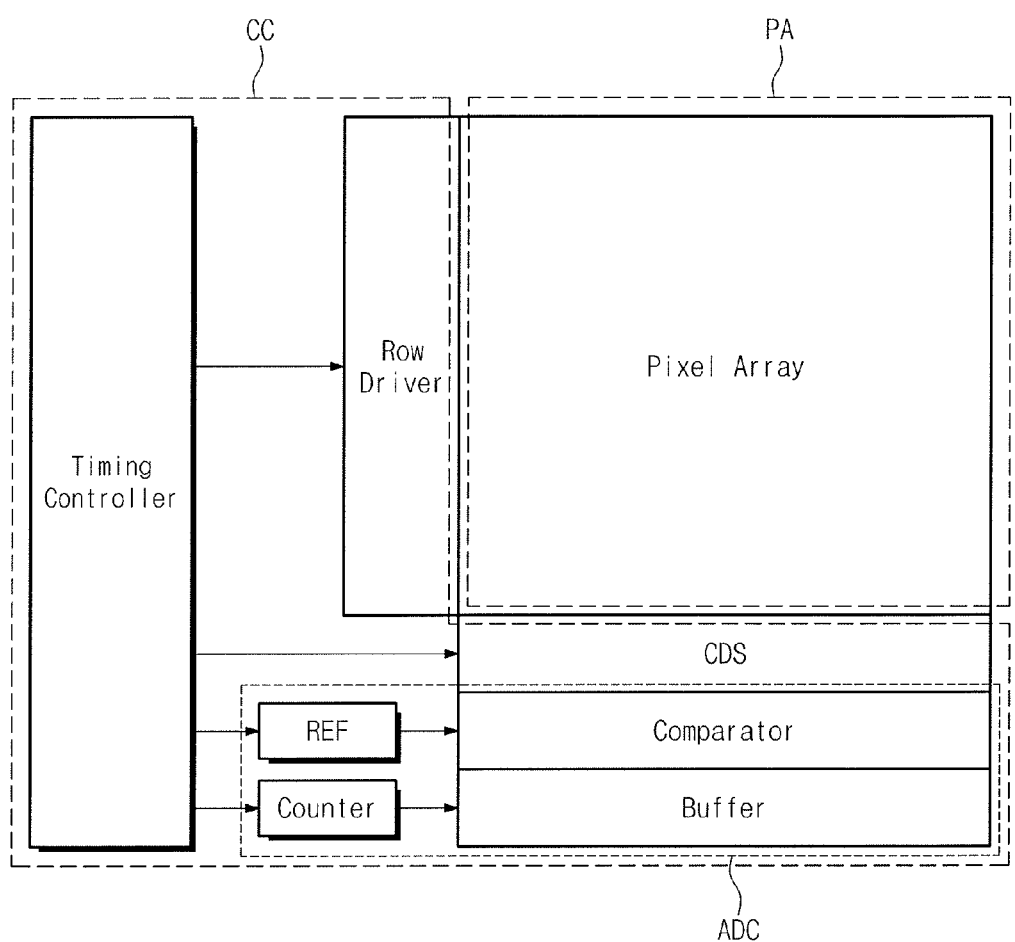
FIG. 1 illustrates a block diagram of an image sensor according to example embodiments.

Example embodiments will now be described more fully hereinafter with reference to the accompanying drawings, in which example embodiments are shown. Example embodiments may, however, be embodied in many different forms and should not be construed as being limited to those set forth herein; rather, these embodiments are provided so that this disclosure will be thorough and complete, and will fully convey the concept of example embodiments to those of ordinary skill in the art.

In the drawing figures, the dimensions of layers, elements, and regions may be exaggerated for clarity. That is, the drawing figures are intended to illustrate the general characteristics of methods, structure and/or materials utilized in certain example embodiments and to supplement the written description provided below. These drawings may be not, however, not to scale, and should not be interpreted as limiting the range of values or properties encompassed by example embodiments. For example, the relative thicknesses and positioning of layers, regions and/or structural elements may be reduced or exaggerated for clarity. In addition, the use of similar or identical reference numbers in the various drawings is intended to indicate the presence of a similar or identical element or feature, and like reference numerals in the drawings denote like elements throughout.

Further, in the drawings figures, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of skill in the art. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a block diagram illustrating an image sensor according to example embodiments. Hereinafter, a complementary metal-oxide semiconductor (CMOS)-type image sensor will be described with reference to FIG. 1.

Referring to FIG. 1, an image sensor may include a pixel array PA and a signal processing unit CC.

The pixel array PA may be configured to convert incident light to electric signals. The pixel array PA may include a plurality of unit pixels arranged in a matrix shape. The pixel array PA may be driven by various driving signals transmitted from the signal processing unit CC and may provide the converted electrical signals to the signal processing unit CC.

The signal processing unit CC may be configured to produce image data from the electric signals transmitted from the pixel array PA. The signal processing unit CC may include a row driver, a correlated double sampler (CDS), an analog-to-digital converter (ADC), and a timing controller.

The row driver may be connected to each row of the pixel array PA and may generate row driving signals for driving rows of the pixel array PA. For example, the row driver may drive the plurality of unit pixels in the pixel array PA by a unit of row.

The CDS may be configured to perform a correlated doubling sampling, e.g., using a capacitor and a switch, and to output analog sampling signals. For example, the correlated doubling sampling may include calculating a difference between a reference voltage representing a reset state of the unit pixels and an output voltage representing a signal component corresponding to incident light, and the analog sampling signals may be generated to have correspondence to an effective signal component. The CDS may include a plurality of CDS circuits respectively connected to column lines of the pixel array PA and may be configured to output the analog sampling signal to each column line.

The ADC may convert the analog sampling signal to a digital image signal.

The ADC may include a reference signal generator (REF), a comparator, a counter, and a buffer. The REF may generate a ramp signal, which will be provided to the comparator as a reference signal, with a constant slope. The comparator may compare the analog sampling signal generated by the CDS and output through each column line with the ramp signal generated by the REF and generate a comparative signal, whose transition point is determined by the effective signal component, based on such comparison. The counter may perform a counting operation for generating a counting signal and provide the counting signal to the buffer. The buffer may include a plurality of latch circuits respectively connected to the column lines, latch the counting signal output from the counter to each column line, in response to transition of each comparative signal, and output the latched counting signal serving as the image data to the outside.

The timing controller may control operation timing of the row driver, the CDS, and the ADC. The timing controller may provide a timing signal and a control signal to the row driver, the CDS, and the ADC.

The analog double sampling of the image sensor has been described with reference to FIG. 1, but in certain embodiments, the image sensor may be configured to perform a digital double sampling (DDS). The DDS may convert analog signals associated with the reset and signal components to digital signals, when the pixel is initialized, and extract an effective signal component from a difference between these digital signals.

Figure 2:
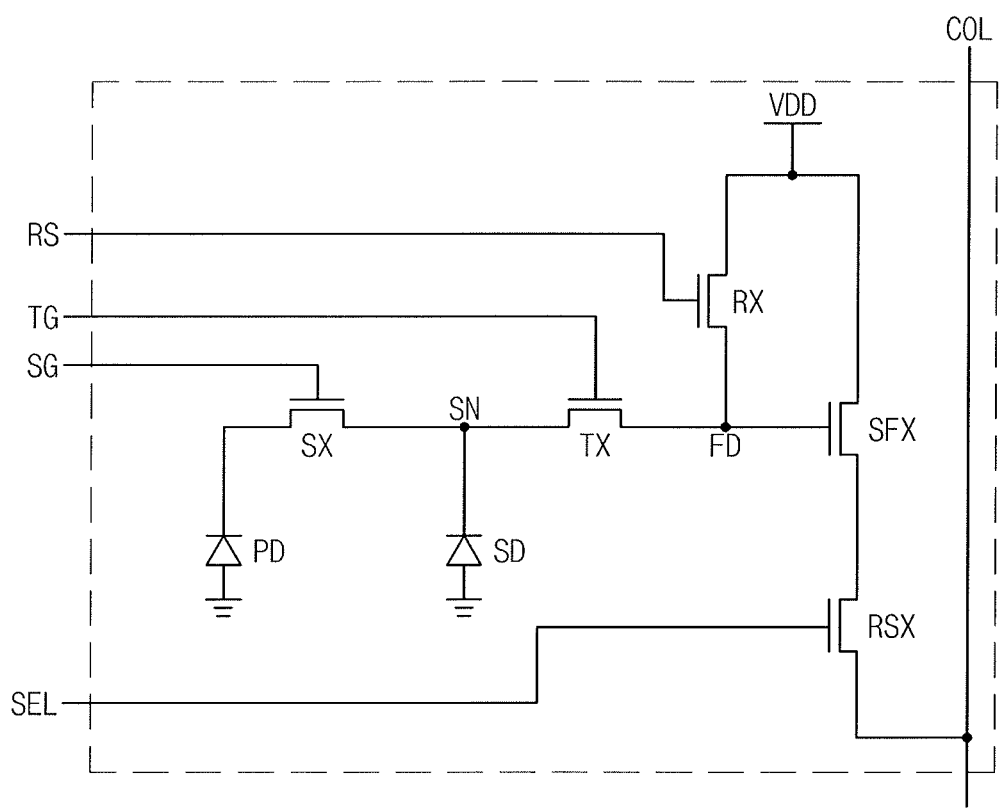
FIG. 2 illustrates an exemplary circuit diagram of one unit pixel in a pixel array according to example embodiments.

FIG. 2 is a circuit diagram exemplarily illustrating one of unit pixels constituting a pixel array according to example embodiments.

Referring to FIG. 2, the unit pixel may include a photoelectric conversion part PD, a photocharge storage, and a read circuit. The photoelectric conversion part PD may include a photodiode, and the photocharge storage may include a storage node SN and a floating diffusion node FD. The read circuit may include a shutter transistor SX, a transfer transistor TX, a reset transistor RX, a source-follower amplifying transistor SFX, and a row selection transistor RSX.

The photoelectric conversion part PD may receive external light (e.g., visible or infrared light) and generate photocharges from the received light. In example embodiments, the unit pixel may include, e.g., a photodiode, a phototransistor, a photogate, or a pinned photodiode, used as the photoelectric conversion part PD.

Photocharges generated in the conversion part PD may be stored in the storage node SN through the shutter transistor SX. The storage node SN may include a storage diode SD. For example, if a shutter control signal has a specific level (e.g., a high level), the shutter transistor SX may be turned-on, and the photocharges generated in the conversion part PD, e.g., in the photodiode PD, may be transferred to the storage diode SD through the shutter transistor SX.

The photocharges temporarily stored in the storage diode SD may be transferred to the floating diffusion node FD through the transfer transistor TX. For example, if a transfer control signal TG has a specific level (e.g., a high level), the transfer transistor TX may be turned-on, and the photocharges generated in the photodiode PD may be transferred to the floating diffusion node FD through the transfer transistor TX.

The source-follower amplifying transistor SFX may generate a signal, whose level is amplified depending on an amount of the photocharge stored in the floating diffusion node FD. The row selection transistor RSX may transfer the amplified signal to a column line COL in response to a selection signal. The source-follower amplifying transistor SFX may have a gate electrode connected to the floating diffusion node FD and may be connected in series to the row selection transistor RSX.

The floating diffusion node FD may be reset by the reset transistor RX. For example, the reset transistor RX may discharge the photocharges stored in the floating diffusion region after every period of the CDS operation, in response a reset signal.

Figure 3A:
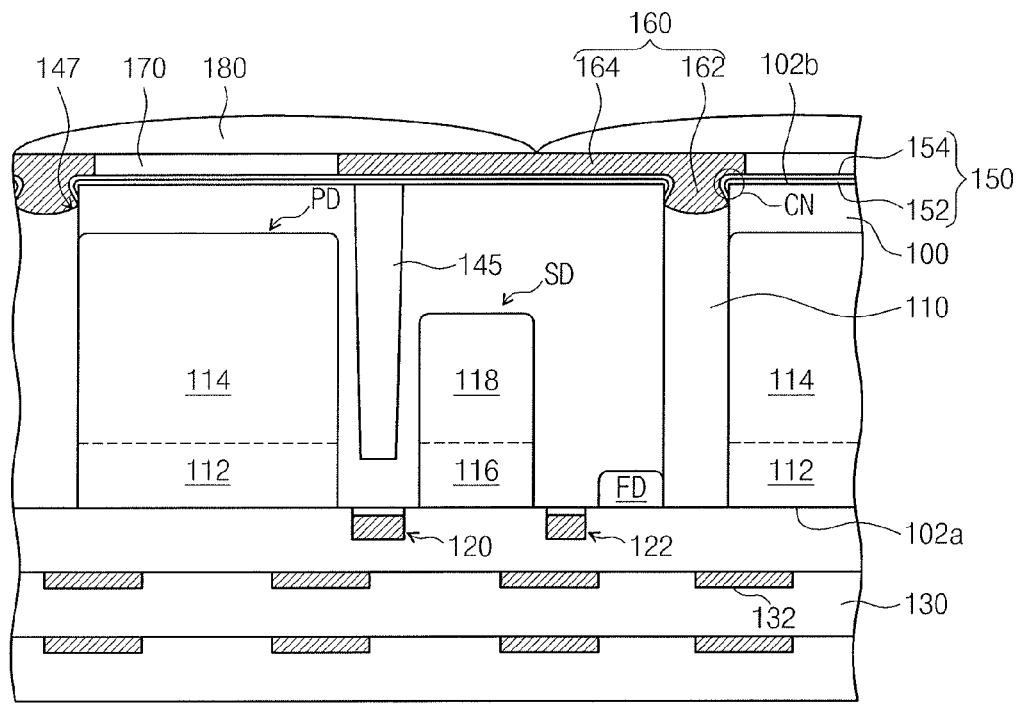
FIGS. 3A through 3C illustrate sectional views of image sensors according to example embodiments.

FIG. 3A is a sectional view illustrating an image sensor according to example embodiments. Referring to FIG. 3A, an image sensor may include a substrate 100, the photoelectric conversion part PD, a photocharge storage, a read circuit, a device isolation part, and a shielding part 160.

The substrate 100 may have a top surface 102a and a bottom surface 102b facing each other. The substrate 100 may include a plurality of unit pixels. In example embodiments, the image sensor may be a backside illuminated image sensor (BIS) configured to produce image data from light which is incident thereto through the bottom surface 102b of the substrate 100. The substrate 100 may include a semiconductor layer grown by an epitaxial process and may be doped to have a p-type conductivity.

The read circuit may be formed on the top surface 102a of the substrate 100. For the BIS-type image sensor, the read circuit may be formed on the top surface 102a of the substrate 100 to perform operations of transferring and amplifying electric signals (e.g., photocharges), which are produced from the incident light. The read circuit may include a plurality of gate structures. For example, the gate structures of the read circuit may include a first gate structure 120 of the shutter transistor SX, a second gate structure 122 of the transfer transistor, a third gate structure of the reset transistor RX, a fourth gate structure of the source-follower amplifying transistor SFX, and a fifth gate structure of the row selection transistor RSX.

The photoelectric conversion part PD may be formed in the substrate 100, and the photocharges generated from the incident light may be accumulated in the photoelectric conversion part PD. In example embodiments, the photoelectric conversion part PD may include a pinned photodiode including an n-type semiconductor region 114, which is formed in the p-type substrate 100, and a p-type semiconductor region 112, which is formed adjacent to the top surface 102a of the substrate 100. The pinned photodiode PD may further include a lightly-doped p-type semiconductor region, which may be formed to cover side and bottom surfaces of the p-type semiconductor region 112. In this case, the p-type semiconductor region may be extended to both sides of the n-type and p-type semiconductor regions 114 and 112.

The photoelectric conversion part PD may be a pinned photodiode, as illustrated in FIG. 3A. However, embodiments are not limited thereto, e.g., the photoelectric conversion part PD may include at least one of a pinned photodiode, a photo transistor, a photo gate, or a photodiode.

The photocharge storage may be formed in the substrate 100 to temporarily store the photocharges generated from the photoelectric conversion part PD. In example embodiments, the photocharge storage may include the storage diode SD and the floating diffusion region FD.

In example embodiments, the storage diode SD may include a pinned diode including an n-type semiconductor region 118, which is formed in the p-type substrate 100, and a p-type semiconductor region 116, which is formed adjacent to the top surface 102a of the substrate 100. The pinned diode may further include a lightly-doped p-type semiconductor region, which may be formed to cover side and bottom surfaces of the n-type semiconductor region 118. According to embodiments, there may be a difference in concentration of n-type impurities between the n-type semiconductor regions 114 and 118 of the photoelectric conversion part PD and the storage diode SD, and this makes it possible to increase movement efficiency of the photocharges.

The photocharges stored in the storage diode SD may be delivered to the floating diffusion region FD in response to a switching operation of the transfer transistor. The floating diffusion region FD may store the photocharges temporarily. In example embodiments, the floating diffusion region FD may include an n-type semiconductor region formed in the substrate 100 and may be formed adjacent to the storage diode SD. The device isolation part may include a first separation pattern 110 defining the unit pixels and a second separation pattern 145 separating the photoelectric conversion part PD from the photocharge storage in each unit pixel.

Figure 4A:
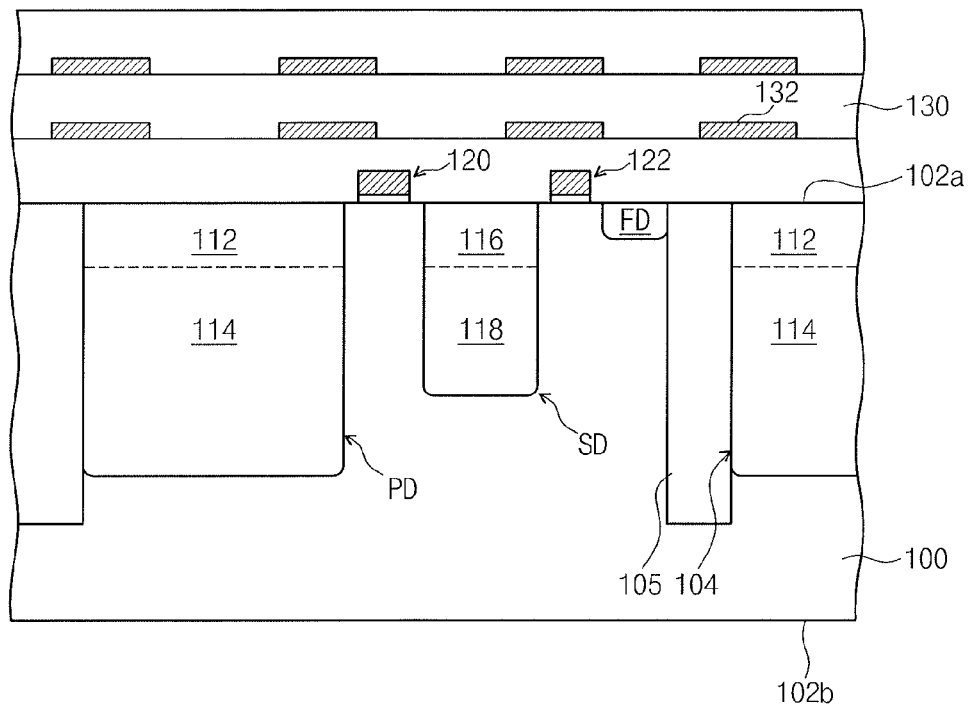
FIGS. 4A through 4H illustrate sectional views of stages in a method of fabricating an image sensor according to example embodiments.

The first separation pattern 110 may include an insulating material and may be formed to fill a first trench 104 penetrating the substrate 100 (FIG. 4A). The first separation pattern 110 may include at least one of high density plasma (HDP) oxide with a good gap-fill property, plasma enhanced chemical vapor deposition (PECVD) oxide, undoped silicate glass (USG), middle temperature oxide (MTO), or silicon nitride (SiN).

In example embodiments, the first separation pattern 110 may have a first end portion with a top surface that is substantially coplanar with the top surface 102a of the substrate 100, and a second end portion with a bottom surface that is lower than the bottom surface 102b of the substrate 100. That is the second end portion of the first separation pattern 110 may be opposite to the first end portion, and a distance between the first and second end portions of the first separation pattern 110 along a normal direction to the substrate 100 may be smaller than a distance between the top and bottom surfaces 102a and 102b of the substrate 100. In example embodiments, the second end portion of the first separation pattern 110 may be formed in such a way that a center portion thereof is lower than an edge portion thereof, e.g., the bottom surface of the second end portion of the first separation pattern 110 may be curved toward the top surface 102a of the substrate 100 to have a concave shape. Accordingly, a recess 147 may be defined by the second end portion of the first separation pattern 110 relative to the bottom surface 102b of the substrate 100.

A first lateral side of the first separation pattern 110 may be in, e.g., direct, contact with the photoelectric conversion part PD. A second lateral side of the first separation pattern 110 may be in, e.g., direct, contact with the floating diffusion region FD of the photocharge storage.

The second separation pattern 145 may be provided in the substrate 100 and between the photoelectric conversion part PD and the photocharge storage to prohibit, e.g., block, light, which is incident into the photoelectric conversion part PD, from propagating into a neighboring photocharge storage. The second separation pattern 145 may extend from the bottom surface 102b of the substrate 100 toward the top surface 102a of the substrate, and may be spaced apart from the top surface 102a of the second separation pattern 145 from the top surface 102a of the substrate 100. Thus, the photoelectric conversion part PD may not be completely isolated from the photocharge storage, e.g., the second separation pattern 145 may be formed to allow the photocharges in the photoelectric conversion part PD to be transferred into the photocharge storage through the portion of the substrate 100. The second separation pattern 145 may include at least one of HDP oxide, PECVD oxide, USG, MTO, or SiN.

The shielding part 160 may be provided on the bottom surface 102b of the substrate 100 to cover the photocharge storage. The shielding part 160 may prohibit. e.g., block, light from being incident into a neighboring photocharge storage. In example embodiments, the shielding part 160 may include a protrusion 162 filling the recess 147, and an extension 164 extended from the protrusion 162 to cover a portion of the bottom surface 102b of the substrate 100 overlapping the photocharge storage. For example, as illustrated in FIG. 3A, the extension 164 covers a portion of the bottom surface 102b of the substrate 100 that overlaps the entire photocharge storage and the top of the second separation pattern 145. The shielding part 160 may include a metallic material, e.g., tungsten and aluminum.

The image sensor may further include an anti-reflection layer 150 disposed between the bottom surface 102b of the substrate 100 and a portion of the shielding part 160. The anti-reflection layer 150 may be a transparent layer, which may be formed of at least one of silicon oxide, metal oxide, or nitride. For example, the anti-reflection layer 150 may include one of polyethylene oxide (PEOX), $HfO_x$, and SiN. In example embodiments, as exemplarily shown in FIG. 3A, the anti-reflection layer 150 may include at least two layers 152 and 154.

In example embodiments, the anti-reflection layer 150 may include a portion provided on a corner CN of the bottom surface 102b of the substrate 100 provided with the recess 147 to have an overhang structure. For example, as illustrated in FIG. 3A, the anti-reflection layer 150 may extend, e.g., continuously and conformally, to overlap tops of the photoelectric conversion part PD and the photocharge storage, and may extend beyond top corners CN thereof to cover portions of top lateral sides thereof. For example, the surface of first separation pattern 110 including the recess 147 may be between the top surface 102a of the substrate 100 and an edge of the anti-reflection layer 150 on the lateral sides of the photoelectric conversion part PD and the photocharge storage. In this case, the protrusion 162 of the shielding part 160 may be in direct contact with the first separation pattern 110 and the anti-reflection layer 150. As described above, given that the anti-reflection layer 150 includes a transparent material, the protrusion 162, in conjunction with the first separation pattern 110, may make it possible to more efficiently prohibit light from being incident into the photocharge storage through the bottom surface 102b of the substrate 100.

The image sensor may further include a color filter 170 and a micro lens 180 on the bottom surface 102b of the substrate 100 to allow incident light to propagate into the photoelectric conversion part PD. The color filter 170 may be provided at a position corresponding to, e.g., overlapping, the photoelectric conversion part PD, e.g., the color filter 170 may overlap a majority of a top of the photoelectric conversion part PD. The color filter 170 may be formed at the same level as that of the shielding part 160. For example, the color filter 170 may be on the anti-reflection layer 150, and bottom surfaces of the color filter 170 and the shielding part 160 may be level with each other, and top surfaces of the color filter 170 and the shielding part 160 may be level with each other. The micro lens 180 may allow light to be focused onto the photoelectric conversion part PD, and may be provided on the color filter 170 and the shielding part 160.

Figure 3B:
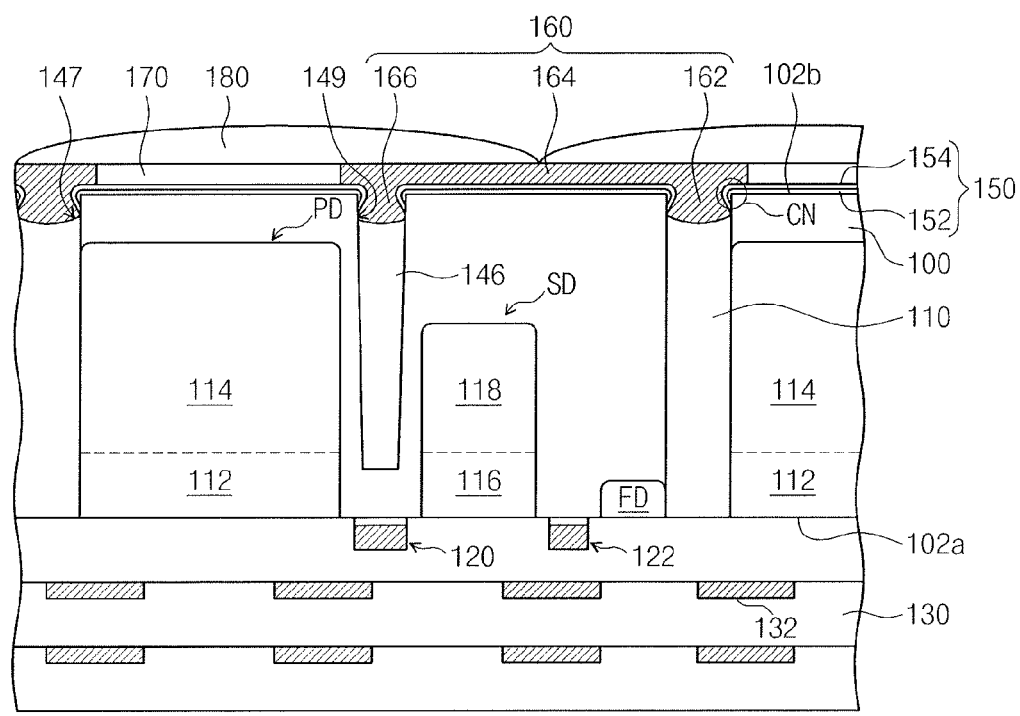
Figure 3C:
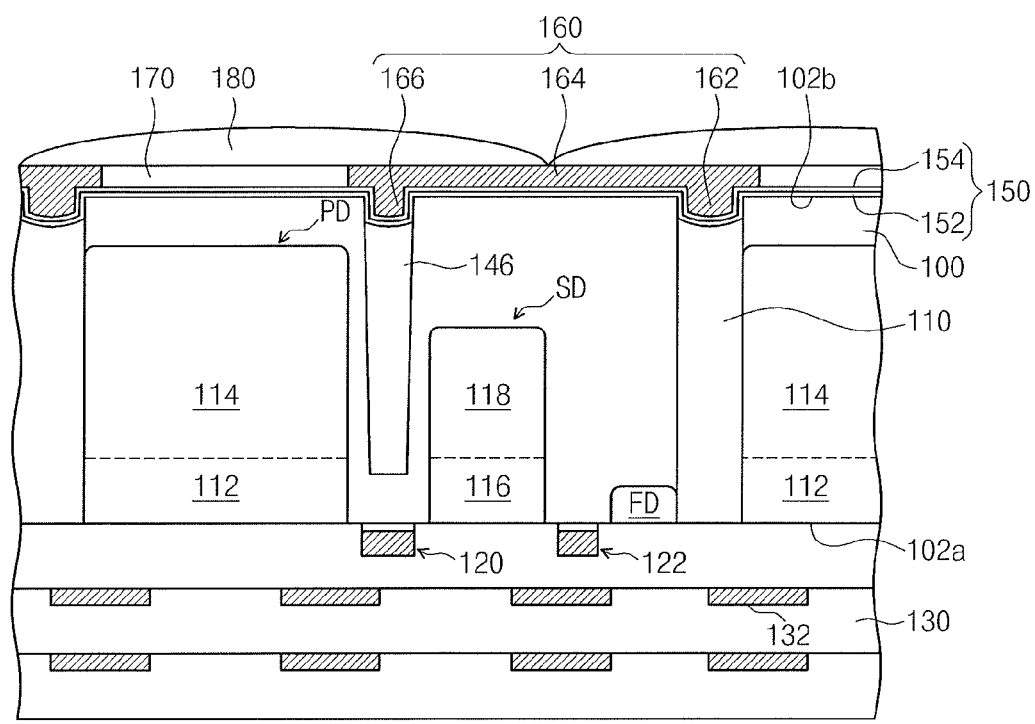

FIGS. 3B and 3C are sectional views illustrating image sensors according to other example embodiments.

Referring to FIGS. 3B and 3C, an image sensor may include the substrate 100, the photoelectric conversion part PD, the photocharge storage, the read circuit, the device isolation part, and the shielding part 160. The image sensor may further include the anti-reflection layer 150 disposed between the substrate 100 the bottom surface 102b and the shielding part 160.

The device isolation part may include the first separation pattern 110 defining the unit pixels, and a second separation pattern 146 separating the photoelectric conversion part PD from the photocharge storage in each unit pixel.

In example embodiments, the first separation pattern 110 may have the first end portion with the surface that is substantially coplanar with the top surface 102a of the substrate 100, and the second end portion with the surface that is lower than the bottom surface 102b of the substrate 100. Accordingly, the first recess 147 may be defined by the first and second end portions of the first separation pattern 110 and the substrate 100.

As illustrated in FIGS. 3B-3C, the second separation pattern 146 may have a first end portion that is spaced apart from the top surface 102a of the substrate 100, and a second end portion opposite to the first end portion. The second end portion has a surface that is lower than the bottom surface 102b of the substrate 100. Accordingly, a second recess 149 may be defined by the first and second end portion of the second separation pattern 146 and the substrate 100.

In the present embodiments, the shielding part 160 may include the first protrusion 162 filling the first recess 147, a second protrusion 166 filling the second recess 149, and the extension 164 connecting the first and second protrusions 162 and 166 to each other. The first and second protrusions 162 and 166 of the shielding part 160, in conjunction with the first and second separation patterns 110 and 146, may make it possible to more efficiently prohibit light from being incident into the photocharge storage through the bottom surface 102b of the substrate 100.

As shown in FIG. 3B, the anti-reflection layer 150 may include an overhang-shaped portion provided on the corner CN of the bottom surface 102b of the substrate 100 with the first and second recesses 147 and 149. The first protrusion 162 may be in direct contact with the first separation pattern 110, and the second protrusion 166 may be in direct contact with the second separation pattern 146.

As shown in FIG. 3C, the anti-reflection layer 150 may be formed to conformally cover the, e.g., entire, bottom surface 102b of the substrate 100 with the first and second recesses 147 and 149. In this case, the first protrusion 162 may be spaced apart from the first separation pattern 110 by the anti-reflection layer 150, and the second protrusion 166 may be spaced apart from the second separation pattern 146 by the anti-reflection layer 150.

Hereinafter, a method of fabricating an image sensor will be described with reference to FIGS. 4A-4H. FIGS. 4A through 4H are sectional views illustrating stages in a method of fabricating an image sensor according to example embodiments.

Referring to FIG. 4A, a preliminary first separation pattern 105, the photoelectric conversion part PD, the photocharge storage, and the read circuit may be formed on the substrate 100.

In detail, the substrate 100 may be a semiconductor substrate 100 that is doped to have a first conductivity type. The first conductivity type may be, for example, a p-type. The substrate 100 may have the top surface 102a and the bottom surface 102b facing each other.

The first trench 104 may be formed in the substrate 100 by etching the top surface 102a of the substrate 100. The preliminary first separation pattern 105 may be formed by filling the first trench 104 with a first insulating material. The first insulating material may include at least one of, e.g., high density plasma (HDP) oxide with a good gap-fill property, plasma enhanced chemical vapor deposition (PECVD) oxide, undoped silicate glass (USG), middle temperature oxide (MTO), or silicon nitride (SiN). The preliminary first separation pattern 105 may be formed to define a plurality of unit pixels.

The photoelectric conversion part PD and the photocharge storage may be formed in each of the unit pixels. As an example, one photoelectric conversion part PD and one photocharge storage may be formed in each unit pixel.

In example embodiments, the formation of the photoelectric conversion part PD may include forming the first region 114 using, e.g., an implantation process, and forming the second region 112 in an upper portion of the first region 114 using, e.g., another implantation process. Here, the first region 114 may be formed to have a second conductivity type (e.g., n-type) different from the first conductivity type and a first concentration, and the second region 112 may be formed to have the first conductivity type.

The photocharge storage may include the storage diode SD and the floating diffusion region FD. In example embodiments, the formation of the storage diode SD may include forming the third region 118 in the substrate 100 using an implantation process to have the second conductivity type and a second concentration, and forming the fourth region 116 in an upper portion of the third region 118 using, e.g., another implantation process to have the first conductivity type. Here, the first concentration of the first region 114 may be different from the second concentration of the second region 118. The floating diffusion region FD may be formed by injecting impurities of the second conductivity type into the substrate 100.

The read circuit may include a plurality of transistors formed on the top surface 102a of the substrate 100. Although FIG. 4A shows parts (e.g., the shutter and transfer gates 120 and 122) of the read circuit formed on the substrate 100, the read circuit may further include the reset gate, the source-follower amplifying gate, and/or the row selection gate.

An interlayered insulating layer 130 may be formed to cover the read circuit. Contact plugs (not shown) may be formed to be electrically connected to the read circuit, and interconnection lines 132 may be formed to be electrically connected to the contact plugs.

Figure 4B:
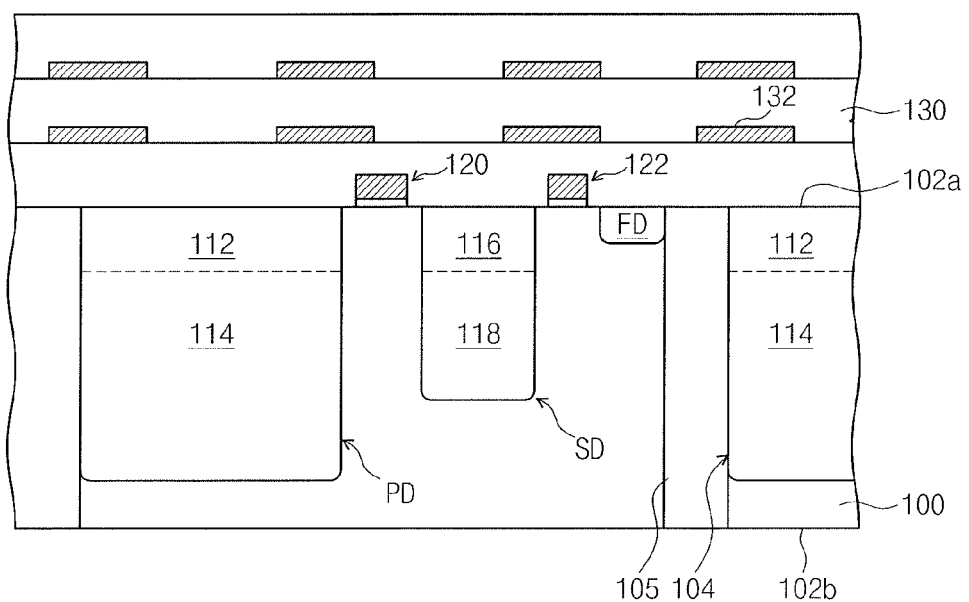

Referring to FIG. 4B, a grinding process may be performed on the bottom surface 102b of the substrate 100 to expose a bottom surface of the preliminary first separation pattern 105. Accordingly, the preliminary first separation pattern 105 may have a structure penetrating the substrate 100. In example embodiments, the preliminary first separation pattern 105 may have an end portion with a surface that is coplanar with the top surface 102a of the substrate 100, and an opposite end portion with a surface that is coplanar with the bottom surface 102b of the substrate 100.

Figure 4C:
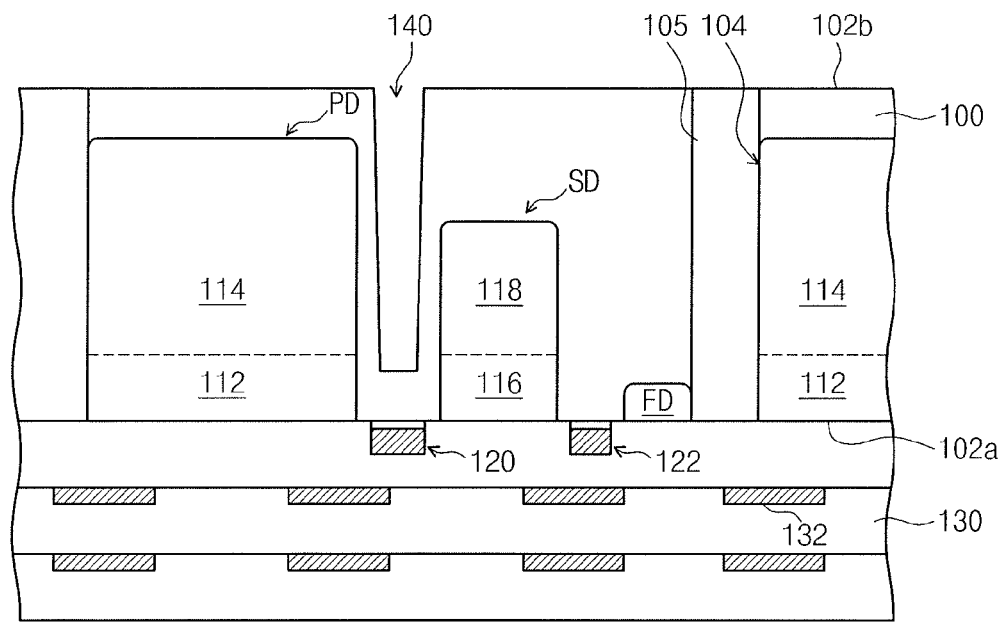

Referring to FIG. 4C, the bottom surface 102b of the substrate 100 may be etched to form a second trench 140 in the substrate 100. The second trench 140 may be formed between the photoelectric conversion part PD and the photocharge storage. The second trench 140 may have a bottom surface which is spaced apart from the top surface 102a of the substrate 100 by a predetermined distance.

Figure 4D:
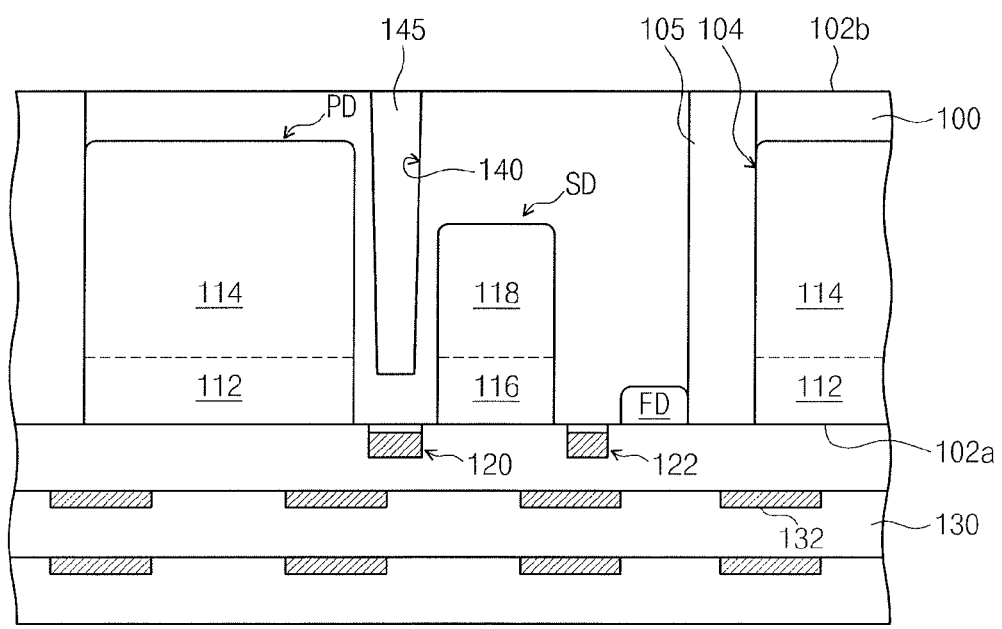

Referring to FIG. 4D, the second trench 140 may be filled with a second insulating material to form the second separation pattern 145. The second insulating material may include a material having an etch selectivity with respect to (e.g., an etch rate different from) the first insulating material. The second insulating material may include at least one of, e.g., HDP oxide, USG, MTO, PECVD oxide, PEOX, SiN, or SiON. For example, in the case where the first insulating material includes a nitride material, e.g., SiN or SiON, the second insulating layer may be formed of or include at least one oxide material, e.g., HDP oxide, USG, MTO, PECVD oxide, and PEOX. The second separation pattern 145 may be formed to have an end portion with a surface that is spaced apart from the top surface 102a of the substrate 100, and an opposite end portion with a surface that is substantially coplanar with the bottom surface 102b of the substrate 100.

Figure 4E:
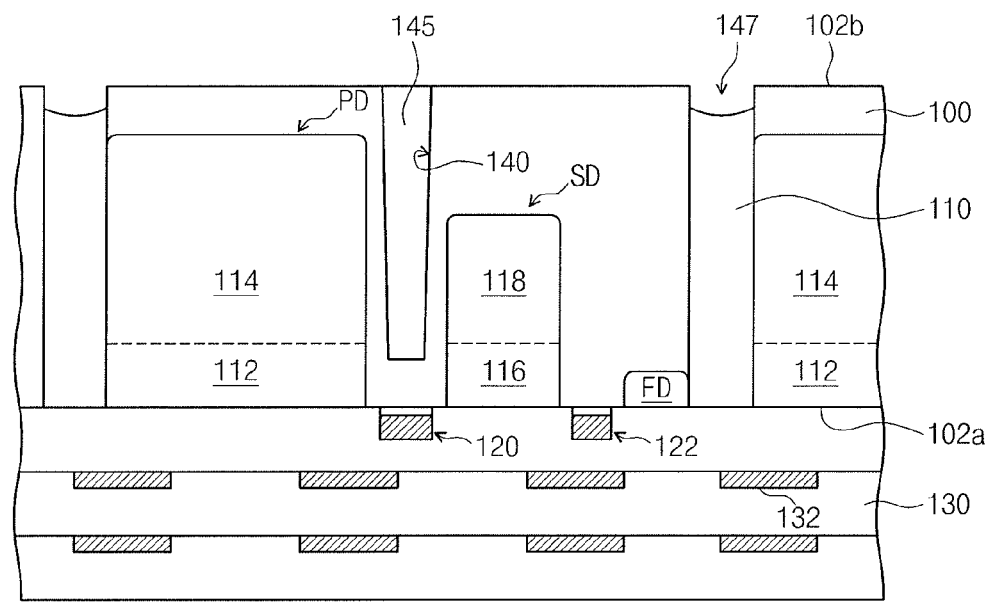

Referring to FIG. 4E, the opposite end portion of the preliminary first separation pattern 105 may be etched to form the first separation pattern 110. In example embodiments, the opposite end portion of the preliminary first separation pattern 105 may be etched using an etch-back process or a wet etching process, without using any mask. As a result of the etching process, the first separation pattern 110 may be formed to have a surface of a curvedly recessed profile. Accordingly, the first separation pattern 110 and the substrate 100 may define the recess 147. The first separation pattern 110, along with the second separation pattern 145, may constitute the device isolation part.

Figure 4F:
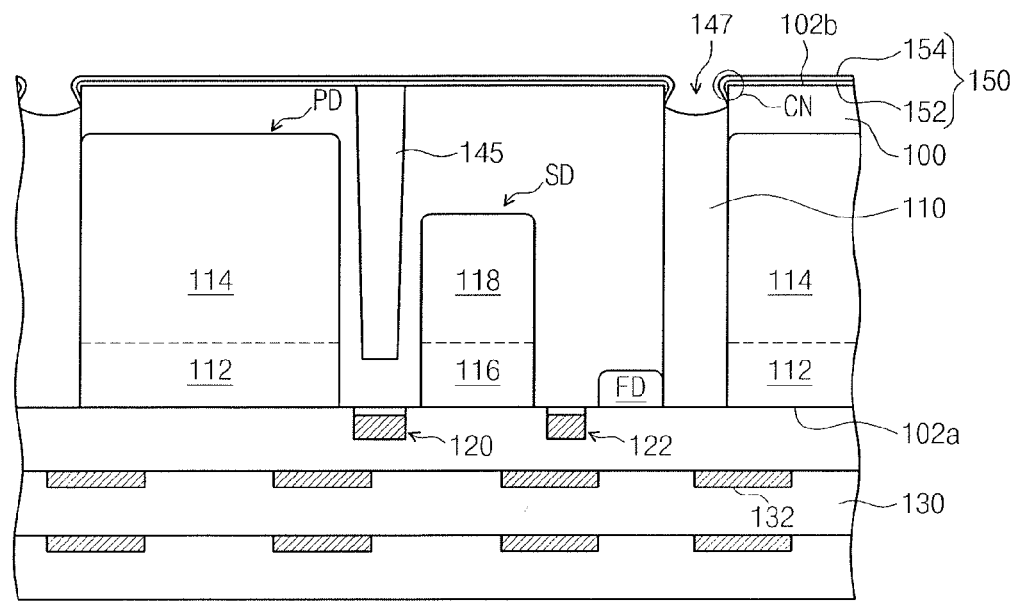

Referring to FIG. 4F, the anti-reflection layer 150 may be formed on the bottom surface 102b of the substrate 100. In the present embodiment, the anti-reflection layer 150 may be formed using a deposition process, and the anti-reflection layer 150 may be formed to locally cover the corner CN of the substrate 100 exposed by the recess 147, thereby having an overhang structure. For example, on the bottom surface 102b of the substrate 100 with the recess 147, the anti-reflection layer 150 may be formed to expose the first separation pattern 110.

The anti-reflection layer 150 may be formed to include a plurality of layers 152 and 154. The anti-reflection layer 150 may be a transparent layer, which may be formed of, e.g., at least one of silicon oxide, metal oxide, or nitride. For example, the anti-reflection layer 150 may be formed of or include one of, e.g., polyethylene oxide (PEOX), HfOx, and SiN.

Figure 4G:
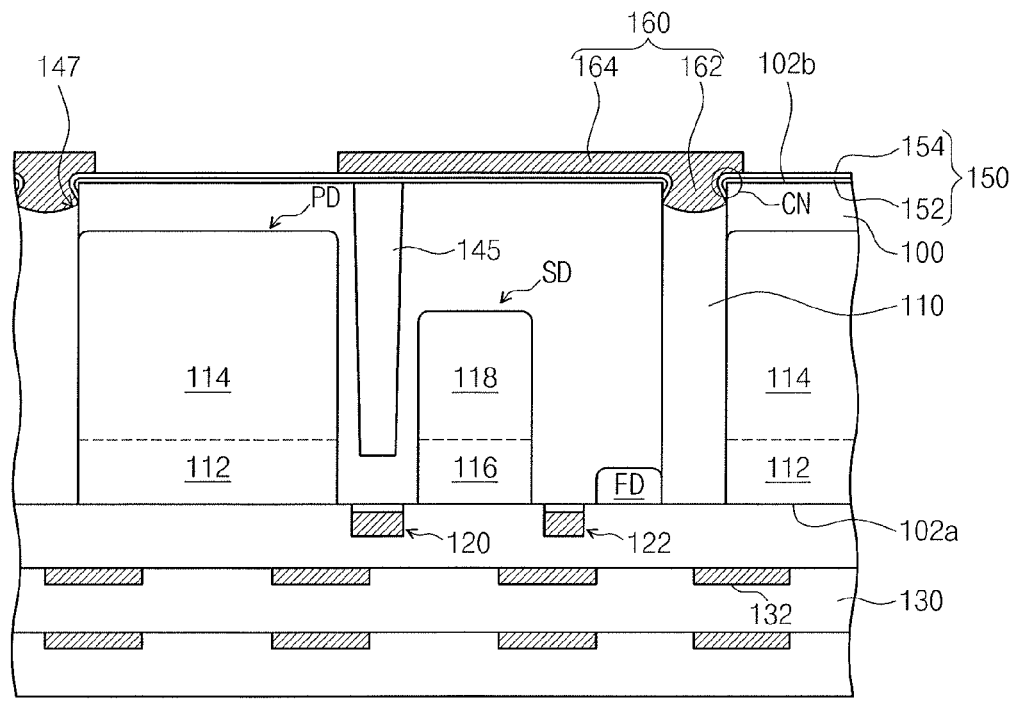

Referring to FIG. 4G, the shielding part 160 may be formed on the anti-reflection layer 150 to fill the recess 147 and cover the photocharge storage.

In detail, a metal layer (not shown) may be formed on the, e.g., entire, bottom surface 102b of the substrate 100 with the recess 147. The metal layer may be formed of or include at least one of tungsten or aluminum.

The metal layer may be etched to form the shielding part 160 covering the photocharge storage. That is, portions of the metal layer may be removed to expose the photoelectric conversion part PD, such that the protrusion 162 filling the recess 147 and the extension 164 extended from the protrusion 162 to cover the bottom surface 102b of the substrate 100 may be formed. In the present embodiment, at least a portion of the protrusion 162 of the shielding part 160 may be in direct contact with the first separation pattern 110.

Since, as described above, the metal layer is formed to fill the recess 147, the protrusion 162 may be self-aligned with the first separation pattern 110. Accordingly, it is possible to omit an additional etching process and thereby to increase an alignment margin for the protrusion 162 of the shielding part 160.

The protrusion 162 of the shielding part 160, in conjunction with the first separation pattern 110, may prevent light, which is obliquely incident into the photoelectric conversion part PD, from being incident into the photocharge storage. Also, the extension 164 of the shielding part 160 may prevent light from being incident into the photocharge storage in a direction normal to a top surface thereof.

Figure 4H:
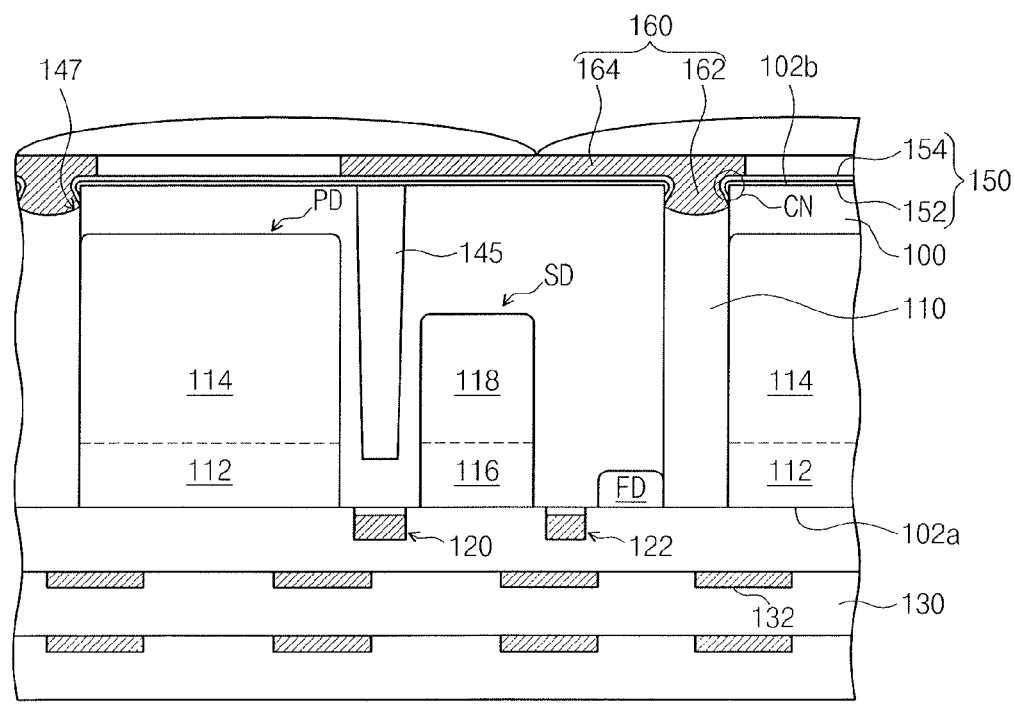

Referring to FIG. 4H, the color filter 170 may be formed on the exposed photoelectric conversion part PD. The micro lens 180 may be formed on the bottom surface 102b of the substrate 100.

Figure 5A:
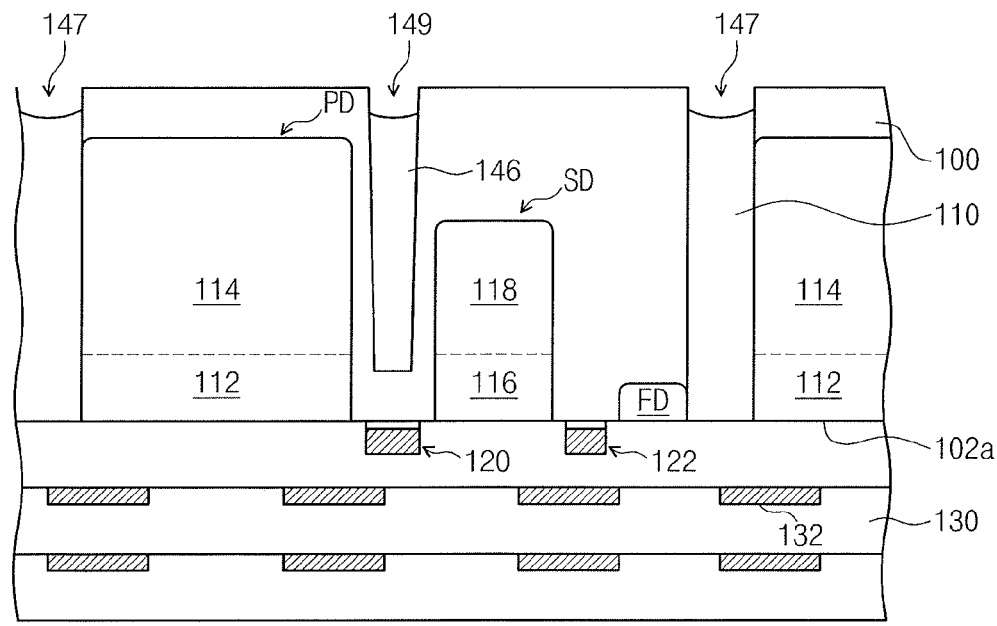
FIGS. 5A through 5C illustrate sectional views of stages in a method of fabricating an image sensor according to other example embodiments.
Figure 5B:
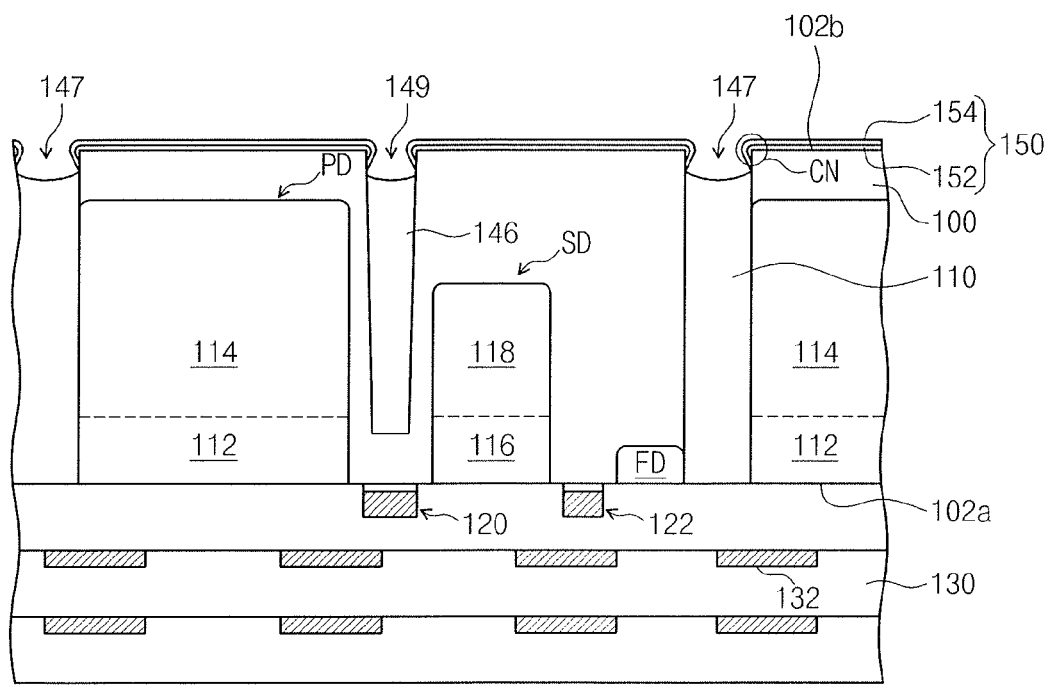
Figure 5C:
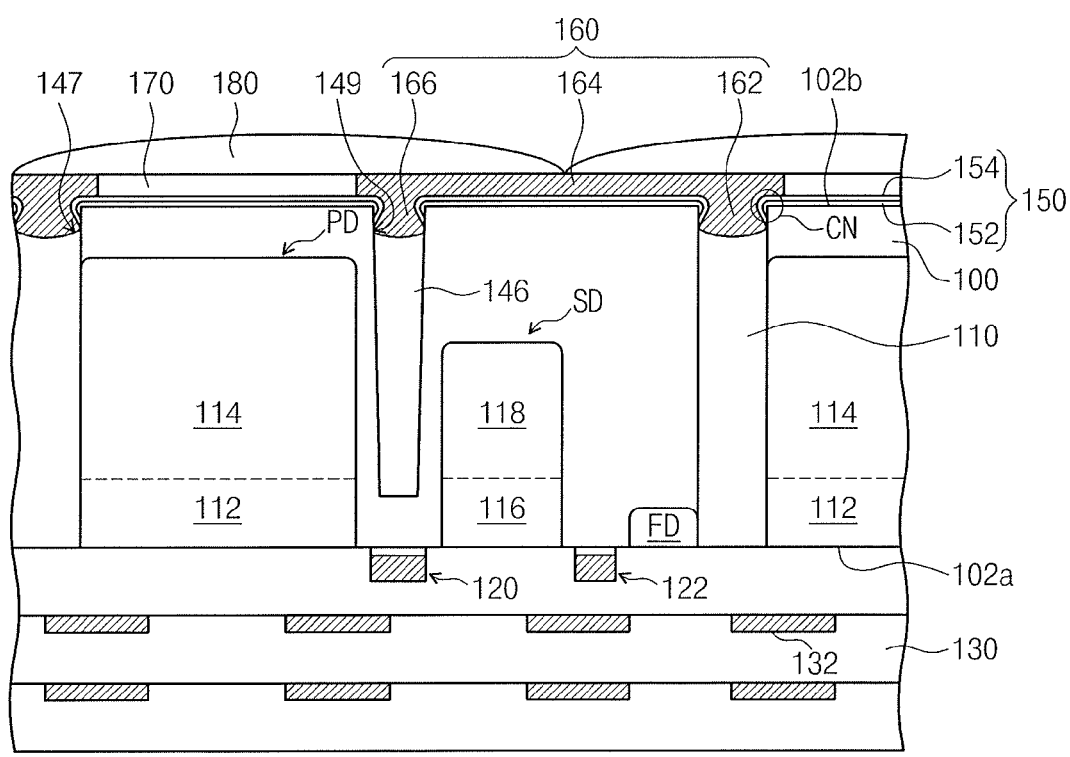

FIGS. 5A through 5C are sectional views illustrating stages in a method of fabricating an image sensor according to other example embodiments.

Referring to FIG. 5A, the preliminary first separation pattern 105, the preliminary second separation pattern 145, the photoelectric conversion part PD, the photocharge storage, and the read circuit may be formed on the substrate 100.

The process of forming the preliminary first and second separation patterns 105 and 145, the photoelectric conversion part PD, the photocharge storage, and the read circuit may be performed using substantially the same method as described previously with reference to FIGS. 4A through 4D. Thus, a detailed description thereof may be omitted.

The first separation pattern 110 and a second separation pattern 146 may be formed by etching the opposite end portions of the preliminary first and second separation patterns 105 and 145. Here, the first and second separation patterns 105 and 145 may be formed of insulating materials having no etch selectivity with respect to each other.

In example embodiments, the opposite end portions of the preliminary first and second separation patterns 105 and 145 may be etched using an etch-back process or a wet etching process, without using any mask. The etching process may be performed in such a way that a surface of the first separation pattern 110 has a curvedly recessed profile (i.e., have a center lower than an edge), and thus, the first recess 147 may be defined by the first separation pattern 110 and the substrate 100. Similarly, the second separation pattern 146 may have a surface having a curvedly recessed profile or having a center lower than an edge, and thus, the second recess 149 may be defined by the second separation pattern 146 and the substrate 100.

Referring to FIG. 5B, the anti-reflection layer 150 may be formed on the bottom surface 102b of the substrate 100 with the first and second recesses 147 and 149. In the present embodiment, the anti-reflection layer 150 may be formed using a deposition process, and the anti-reflection layer 150 may be formed to locally cover the corner CN of the substrate 100 exposed by the first and second recesses 147 and 149, thereby having an overhang structure.

The anti-reflection layer 150 may be formed to conformally cover the bottom surface 102b of the substrate 100 with the first and second recesses 147 and 149. In this case, the resulting image sensor may have the structure shown in FIG. 3C.

Referring to FIG. 5C, the shielding part 160 may be formed to fill the first and second recesses 147 and 149 provided with the anti-reflection layer and cover the photocharge storage. The shielding part 160 may include the first protrusion 162 filling the first recess 147, the second protrusion 166 filling the second recess 149, and the extension 164 connecting the first and second protrusions 162 and 166 to each other. Thereafter, the color filter 170 and the micro lens 180 may be formed on the bottom surface 102b of the substrate 100.

Figure 6:
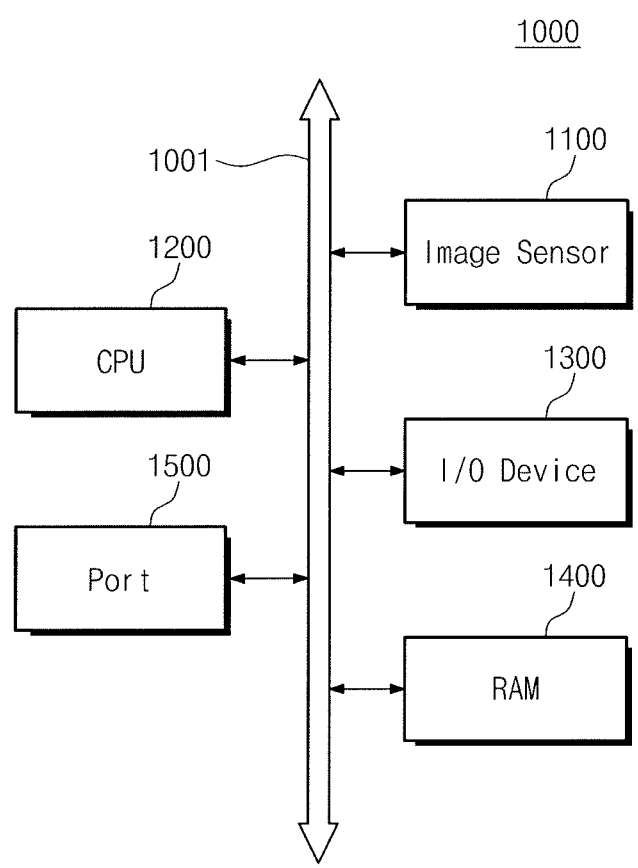
FIG. 6 illustrates a schematic block diagram of a processor-based system including an image sensor according to example embodiments.

FIG. 6 is a schematic block diagram illustrating a processor-based system including an image sensor according to example embodiments.

Referring to FIG. 6, a processor-based system 1000 is a system that processes output images of an image sensor 1100.

The system 1000 may include one of, e.g., a computer system, a camera system, a scanner, a mechanical clock system, a navigation system, a video phone, a monitoring system, an automatic focus system, a tracking system, an operation monitoring system, and an image stabilizing system. However, example embodiments are not limited thereto.

The processor-based system 1000, e.g., a computer system, may include a central processing unit (CPU) 1200, e.g., a microprocessor capable of communicating with an input/output (I/O) device 1300 via a bus 1001. The image sensor 1100 may communicate with the CPU 1200 and/or the I/O device 1300 via the bus 1001 or any other communication link. The processor-based system 1000 may further include a read access memory (RAM) 1400 and/or a port 1500 capable of communicating with the CPU 1200 through the bus 1001.

The port 1500 may be coupled with, e.g., a video card, a sound card, a memory card, a USB device, or the like. Further, the port 1500 may be connected to an additional system to carry out data communication with the additional system. The image sensor 1100 may be integrated with, e.g., a CPU, a digital signal processing device (DSP), or a microprocessor. Moreover, the image sensor 1100 may be integrated with a memory. Alternatively, the image sensor 1100 may be integrated in a chip different from that of a processor.

Figure 7:
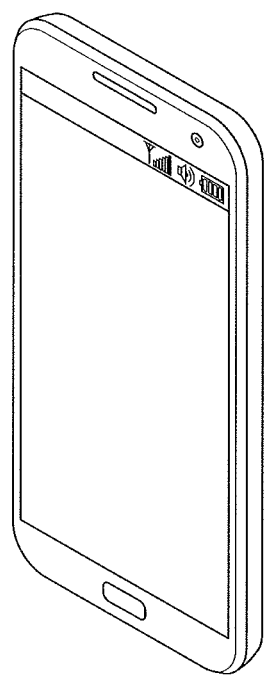
FIG. 7 illustrates a perspective view of an example of an electronic device including an image sensor according to example embodiments.

FIG. 7 is a perspective view illustrating an example of electronic devices including an image sensor according to example embodiments.

Referring to FIG. 7, the image sensor according to an embodiment may be applicable to mobile phones 2000. Further, the image sensor according to the embodiment may also be applicable to, e.g., cameras, camcorders, personal digital assistants (PDAs), wireless phones, laptop computers, optical mice, facsimile machines or copying machines. In addition, the image sensor according to the embodiment may also be installed in, e.g., telescopes, mobile phone handsets, scanners, endoscopes, fingerprint recognition systems, toys, game machines, household robots, or automobiles.

Example embodiments provide a highly-integrated image sensor. That is, according to example embodiments, a protrusion of a shielding part may be provided on a first separation pattern defining a unit pixel of an image sensor to prevent light obliquely incident into the photoelectric conversion part from propagating into the photocharge storage. A preliminary first separation pattern may be etched to form a recess defined by the first separation pattern and the substrate, and the protrusion of the shielding part may be formed to fill the recess. Accordingly, the protrusion of the shielding part may be self-aligned with the first separation pattern.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An image sensor, comprising:
   a substrate with a unit pixel defined by a first separation pattern;
   a photoelectric conversion part in the substrate;
   a photocharge storage in the substrate, the photocharge storage being adjacent to the photoelectric conversion part;
   a second separation pattern between the photoelectric conversion part and the photocharge storage;
   a shielding part on a bottom surface of the substrate to cover the photocharge storage, the shielding part including:

a first protrusion extending into the substrate and toward the first separation pattern, and an extension extending from the first protrusion to cover the bottom surface of the substrate; and an anti-reflection layer between the shielding part and the substrate, the anti-reflection layer having an overhang structure between the first protrusion and the extension.

2. The image sensor as claimed in claim 1, wherein the anti-reflection layer is spaced apart from the first separation pattern.

3. The image sensor as claimed in claim 1, wherein the first protrusion of the shielding part is in direct contact with the first separation pattern.

4. The image sensor as claimed in claim 1, wherein the first separation pattern has a surface positioned near the bottom surface of the substrate, a center region of the surface of the first separation pattern being lower than its edge region.

5. The image sensor as claimed in claim 1, wherein the shielding part further comprises a second protrusion extending from the extension into the substrate and toward the second separation pattern, the second protrusion being continuously connected to the extension.

6. The image sensor as claimed in claim 5, wherein the second separation pattern has a surface positioned near the bottom surface of the substrate, a center region of the surface of the second separation pattern being lower than its edge region.

7. The image sensor as claimed in claim 5, wherein the anti-reflection layer has an overhang structure between the second protrusion and the extension, and the anti-reflection layer is spaced apart from the second separation pattern.

8. The image sensor as claimed in claim 5, wherein the anti-reflection layer is conformally provided between the second protrusion and the second separation pattern, and is in direct contact with the second separation pattern.

9. The image sensor as claimed in claim 1, wherein the first protrusion of the shielding part is self-aligned with the first separation pattern.

10. The image sensor as claimed in claim 5, wherein the second protrusion of the shielding part is self-aligned with the second separation pattern.

11. An image sensor, comprising:
a substrate with a unit pixel defined by a first separation pattern;
a photoelectric conversion part in the substrate;
a photocharge storage in the substrate, the photocharge storage being adjacent to the photoelectric conversion part;
a second separation pattern between the photoelectric conversion part and the photocharge storage;
a shielding part on a bottom surface of the substrate to cover the photocharge storage, the shielding part including:
a first protrusion extending into the substrate and toward the first separation pattern,
a second protrusion extending into the substrate and toward the second separation pattern, and
an extension connecting the first and second protrusions to each other.

12. The image sensor as claimed in claim 11, further comprising an anti-reflection layer between the shielding part and the substrate.

13. The image sensor as claimed in claim 12, wherein the anti-reflection layer is conformally provided on the bottom surface of the substrate and the first and second separation patterns.

14. The image sensor as claimed in claim 12, wherein the anti-reflection layer is spaced apart from the first separation pattern and has an overhang structure between the first protrusion and the extension.

15. The image sensor as claimed in claim 12, wherein the anti-reflection layer is spaced apart from the second separation pattern and has an overhang structure between the second protrusion and the extension.

16. An image sensor, comprising:
a substrate with a unit pixel defined by a first separation pattern;
a photoelectric conversion part in the substrate;
a photocharge storage in the substrate, the photocharge storage being adjacent to the photoelectric conversion part;
a second separation pattern between the photoelectric conversion part and the photocharge storage;
a shielding part on a bottom surface of the substrate to cover the photocharge storage, the shielding part including:
a protrusion extending into the substrate and toward the first separation pattern, and
an extension extending from the protrusion to cover the photocharge storage; and
an anti-reflection layer between the shielding part and the photocharge storage, the anti-reflection layer extending on a surface of the photocharge storage facing away from the substrate and on a portion of a lateral surface of the photocharge storage.

17. The image sensor as claimed in claim 16, wherein the anti-reflection layer is continuous on the surface of the photocharge storage facing away from the substrate and on the portion of the lateral surface of the photocharge storage.

18. The image sensor as claimed in claim 17, wherein the protrusion directly contacts the first separation pattern and the anti-reflection layer.

19. The image sensor as claimed in claim 16, wherein the first separation pattern defines a trench between adjacent unit pixels, the protrusion completely filling the trench and being continuous with the extension of the shielding part.

20. The image sensor as claimed in claim 19, wherein the extension of the shielding part completely covers the photocharge storage and the second separation pattern, and at least a majority surface of the photoelectric conversion part is exposed by the shielding part.

* * * * *